US008188590B2

(12) United States Patent
Lin et al.

(10) Patent No.: US 8,188,590 B2
(45) Date of Patent: May 29, 2012

(54) INTEGRATED CIRCUIT PACKAGE SYSTEM WITH POST-PASSIVATION INTERCONNECTION AND INTEGRATION

(75) Inventors: Yaojin Lin, Singapore (SG); Pandi Chelvam Marimuthu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 433 days.

(21) Appl. No.: 11/843,649

(22) Filed: Aug. 23, 2007

(65) Prior Publication Data

US 2007/0284726 A1 Dec. 13, 2007

Related U.S. Application Data

(63) Continuation-in-part of application No. 11/278,002, filed on Mar. 30, 2006, now abandoned.

(51) Int. Cl.
*H01L 23/50* (2006.01)

(52) U.S. Cl. ........ 257/698; 257/598; 257/692; 257/756; 257/759

(58) Field of Classification Search .................. 257/773, 257/698, 772, 779, E23.015, E23.02, E23.023–E23.079, 257/E21.508–E21.509, E21.519
See application file for complete search history.

(56) References Cited

U.S. PATENT DOCUMENTS 5,370,766 A 12/1994 Desaigoudar et al.
5,446,311 A 8/1995 Ewen et al.
5,478,773 A 12/1995 Dow et al.
6,075,427 A 6/2000 Tai et al.
6,180,445 B1 1/2001 Tsai
6,294,420 B1 9/2001 Tsu et al.
6,534,374 B2 3/2003 Johnson et al.
6,636,139 B2 10/2003 Tsai et al.
6,761,963 B2 7/2004 Casper et al.
6,900,708 B2 5/2005 White et al.
6,933,614 B2 8/2005 Lee et al.
7,068,139 B2 6/2006 Harris et al.
7,084,515 B2 8/2006 Fuller et al.
7,220,667 B2 5/2007 Yamagata
2002/0180026 A1* 12/2002 Liu et al. ........................ 257/692
2003/0219956 A1 11/2003 Mori et al.
2004/0007778 A1* 1/2004 Shinozaki et al. ............ 257/759
2005/0017361 A1* 1/2005 Lin et al. ........................ 257/756
2005/0054155 A1 3/2005 Song et al.
2005/0127393 A1 6/2005 Kurokawa
2005/0212106 A1 9/2005 Kwon et al.
2005/0253255 A1 11/2005 Degani et al.
2007/0231251 A1 10/2007 Itsuki et al.

* cited by examiner

*Primary Examiner* — Wai Sing Louie
*Assistant Examiner* — Sue Tang
(74) *Attorney, Agent, or Firm* — Ishimaru & Associates LLP; Mikio Ishimaru; Stanley Chang

(57) ABSTRACT

An integrated circuit package system including: providing an integrated circuit die, forming a first layer over the integrated circuit die, forming a bridge on and in the first layer, forming a second layer on the first layer, and forming bump pads on and in the second layer, the bump pads connected to ends of the bridge.

10 Claims, 5 Drawing Sheets

INTEGRATED CIRCUIT PACKAGE SYSTEM WITH POST-PASSIVATION INTERCONNECTION AND INTEGRATION

CROSS-REFERENCE TO RELATED APPLICATION(S)

This is a continuation-in-part of co-pending U.S. patent application Ser. No. 11/278,002 filed Mar. 30, 2006.

TECHNICAL FIELD

The present invention relates generally to integrated circuits and more particularly to integrated circuit packaging.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large-scale integration have underscored the need for back-end semiconductor manufacturing to provide more solutions involving the integrated circuit itself. Numerous technologies have been developed to meet these requirements. Some of the research and development strategies focus on new package technologies while others focus on improving the existing and mature package technologies. Both approaches may include additional processing of the integrated circuits to better match the targeted package.

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Numerous integrated circuit designs are aimed for mixed-signal designs by incorporating analog functions. One of the major challenges in the creation of analog processing circuitry (using digital processing procedures and equipment) is that a number of the components that are used for analog circuitry are large in size and are therefore not readily integrated into integrated circuits. The main components that offer a challenge in this respect are capacitors and inductors, since both these components are, for typical analog processing circuits, of considerable size. In response to the demands for improved package performance and analog circuitry integration, packaging manufacturers may prepare the integrated circuit for packaging as well as provide analog circuitry integration onto the integrated circuit.

With the rapid migration of on-chip interconnect from aluminum (Al) to copper (Cu), the demand for off-chip interconnects is increasing. The conventional gold wire bonding technologies are facing challenges with bare copper pads because pad oxidation inhibits a mature bonding process.

Thus, a need still remains for an integrated circuit package system with post-passivation interconnection and integration providing low cost manufacturing, improved yields, reduce the integrated circuit package dimensions, and provide flexible connectivity and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an integrated circuit die, forming a first layer over the integrated circuit die, forming a bridge on and in the first layer, forming a second layer on the first layer, and forming bump pads on and in the second layer, the bump pads connected to ends of the bridge.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same or similar elements.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure. The term "bridge" as used herein refers to a horizontal electrical structure electrically connected at least at the horizontal ends to other electrical structures.

Figure 1A:
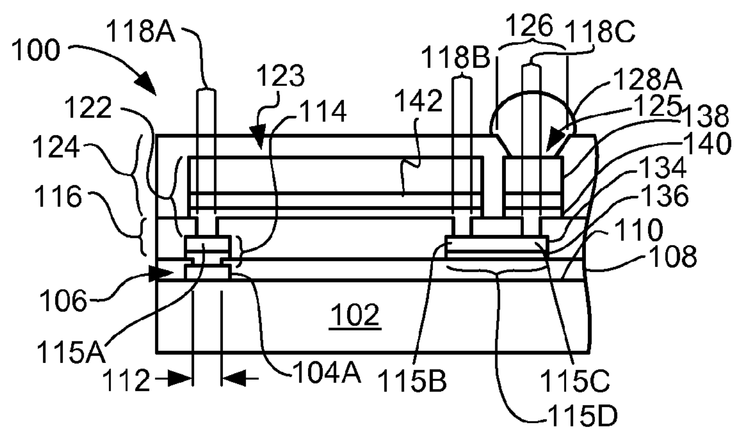
FIG. 1A is a cross-sectional view of a first integrated circuit package system with post-passivation interconnection and integration in an embodiment of the present invention.

Referring now to FIG. 1A, therein is shown a cross-sectional view of a first integrated circuit package system 100 with post-passivation interconnection and integration in an embodiment of the present invention. The first integrated circuit package system 100 includes an integrated circuit die 102 having a bond pad 104A, such as an input/output (IO) pad, provided thereon. The bond pad 104A may be formed from a final metal layer 106 of the semiconductor process used to manufacture the integrated circuit die 102. The bond pad 104A is connected to conductive channels, vias, transistors, passive circuit, or other integrated circuit structures (not shown) in the integrated circuit die 102. The bond pad 104A may be formed by a number of metals, such as aluminum (Al), copper (Cu), or alloys.

A passivation layer 108 forms a first layer that covers an active side 110 of the integrated circuit die 102 and has a passivation opening 112 exposing the bond pad 104A. The passivation layer 108 is used to protect the underlying devices, such as transistors or polysilicon passive circuit element structures from penetration of mobile ions, moisture, transition metals (such as gold or silver for integrated circuit structures), and other contaminants. By way of example, the passivation layer 108 may be a composite of oxides and nitrides.

A first metal layer 114, such as a post-passivation metal one (MI) layer, is formed on the bond pad 104A patterned on the passivation layer 108 to form contacts 115A-C and a bridge 115D. The contacts 115A-C are called "contacts" because they contact the first metal layer 114 and the second metal layer 122. The bridge 115D is called a "bridge" because it connects other electrical structures above the passivation layer; e.g., the bridge 115D connects a redistribution line 123 and a bump pad 125, described below. The bridge 115D is directly on and in the passivation layer 108 and has only one end of the bridge 115D in contact with the integrated circuit die 102.

A first insulation layer 116 forms a second layer, which is deposited and patterned over the passivation layer 108 and over the first metal layer 114. First openings 118A-C in the first insulation layer 116 expose the first metal layer 114 at predetermined locations, such as the contacts 115A-C.

A second metal layer 122 is deposited and patterned on the first metal layer 114 in the first openings 118A-C and on the first insulation layer 116. The processing after patterning forms the redistribution line 123, which connects the bond pad 104A to the contact 115B of the bridge 115D. In at least one embodiment, the redistribution line 123 can be formed between the bond pad 104A and the bridge 115D. The processing further forms a standalone bump pad 125 directly on and in the second layer 116 in contact with the bridge 115D at a location remote from the one end of the bridge 115D in contact with the integrated circuit die 102.

A second insulation layer 124 covers the first insulation layer 116 and covers the second metal layer 122. A second opening 126 in the second insulation layer 124 exposes the second metal layer 122 at predetermined locations, such as the bump pad 125.

A first interconnect 128A, such as a bump or solder ball, is on the second metal layer 122 through the second openings 126, wherein the second metal layer 122 in the second opening 126 is the bump pad 125.

The first interconnect 128A may be used for electrical connections between the integrated circuit die 102 and the outside world.

It has been found that the second insulation layer 124 serves as a stress buffer or protective coat for the second metal layer 122. The second insulation layer 124 in conjunction with the first insulation layer 116 jointly protects the post-passivation stack of the first metal layer 114 and the second metal layer 122 as well as the integrated circuit die 102.

The first metal layer 114 may be a stack of different metals or alloys. The stack may include a first top layer 134, such as a top metal layer, and optionally a first bottom layer 136, such as an adhesion or barrier layer. The first bottom layer 136 may be made from a number of metals or alloys, such as tin (Ti), tin tungsten (TiW), tin nitride (TiN), tantalum (Ta), or tantalum nitride (TaN), with TiW preferred due to its selectivity in the process. The first bottom layer 136 may have a thickness in the range from 200 A to 2000 A. The first top layer 134 may be made from a number of metals and alloys, such as aluminum (Al), Al alloy, gold (Au), or copper (Cu), with a thickness in the range from 1.0 μm to 10.0 μm. Copper is preferred if wire bonding is not required otherwise Al alloy, such as AlCu0.5, is preferred with typical thickness of 1.5 μm.

The first insulation layer 116 may be made from a number of materials, such as polyimide, benzocyclobutene (BCB), polybenzoxazole (PBO), or laminated solder dry film. A typical thickness of the first insulation layer 116 is approximately 5 μm.

The second metal layer 122 may be a stack of different metal or alloys. The stack may include a second top layer 138, a second bottom layer 140, such as an adhesion layer, and optionally a middle layer 142, such as a barrier layer. The second bottom layer 140 may be made from a number of metals or alloys, such as chromium (Cr), Ti, TiW, or Ta, and is typically Ti. If the first top layer 134 is Al or Al alloy then the second bottom layer 140 may be Al. The thickness of the second bottom layer 140 is in the range from 200 A to 1000 A. The middle layer 142 may be made from a number of metals or alloys, such as nickel vanadium (NiV), CrCu, TiW, or TaN, and is typically NiV. The thickness of the middle layer 142 is in the range from 500 A to 3000 A. The second top layer 138 may be made from a number of metals or alloys, such as Cu, with a thickness in the range from 5 μm to 12 μm.

The second insulation layer 124 may be made from a number of materials, such as polyimide, benzocyclobutene (BCB), polybenzoxazole (PBO), or other polymers. A typical thickness of the second insulation layer 124 is in the range from 8 μm to 16 μm.

Figure 1B:
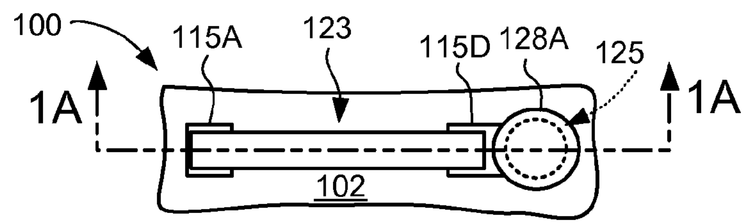
FIG. 1B is a partial top view of FIG. 1A showing a redistribution line and a first interconnect with various layers removed.

Referring now to FIG. 1B, therein is shown a partial top view of FIG. 1A showing the redistribution line 123 and the first interconnect 128A with various layers removed. The redistribution line 123 is connected to the stand alone bump pad 125, which is formed by a portion of the second metal layer 122, which is separated to have the bump pad stand alone. The redistribution line 123 and the stand alone bump pad 125 are connected by the bridge 115D made from the first metal layer 114 formed on the passivation layer 108. The stand alone bump pad 125 is connected to the first interconnect 128A.

It has been discovered that the above arrangement provides symmetrical stress distribution on the stand alone bump pad 125 so that cracking of the second insulation layer 124 is prevented.

Figure 2A:
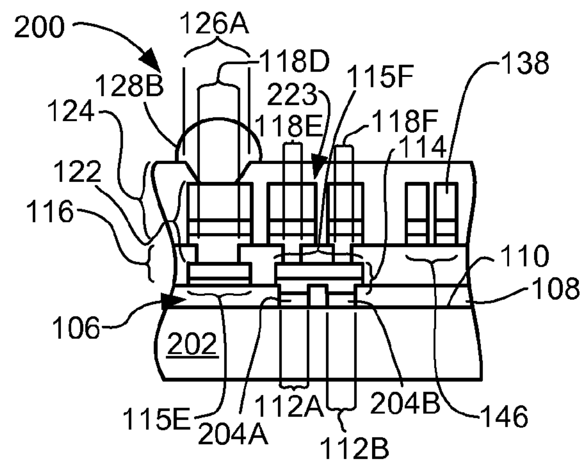
FIG. 2A is a cross-sectional view of a second integrated circuit package system with post-passivation interconnection and integration in an alternative embodiment of the present invention.

Referring now to FIG. 2A, therein is shown a cross-sectional view of a second integrated circuit package system 200 with post-passivation interconnection and integration in an alternative embodiment of the present invention. The second integrated circuit package system 200 includes an integrated circuit die 202 having the bond pads 204A-B formed from the final metal layer 106. The passivation layer 108 covers the active side 110 of the integrated circuit die 202 and exposes the bond pads 204A-B through the passivation openings.

Similarly, the first metal layer 114 is deposited on the bond pads 204A-B through the passivation openings 112A-B as well as on the passivation layer 108. The first metal layer 114 is patterned and processed to form various contacts including the bridges 115E-F. The bridge 115F is on and contacts the bond pads 204A-B through the openings in the passivation layer 108.

The first insulation layer 116 covers the passivation layer 108, and the first metal layer 114 with the first openings 118D-F exposing the first metal layer 114. Predetermined locations of the first metal layer 114 are the bridges 115E-F.

The second metal layer 122 is on the first metal layer 114 in the first openings 118D-F and on the first insulation layer 116 at predetermined locations. The second insulation layer 124 covers the first insulation layer 116 and partially covers the second metal layer 122 with the second opening 126A exposing the second metal layer 122.

The second integrated circuit package system 200 also provides a portion of the first metal layer 114 as the bridge 115F for a circuit component 146, such as an inductor, capacitor, redistribution line, bump pad, etc., formed from a portion of the second metal layer 122.

Figure 2B:
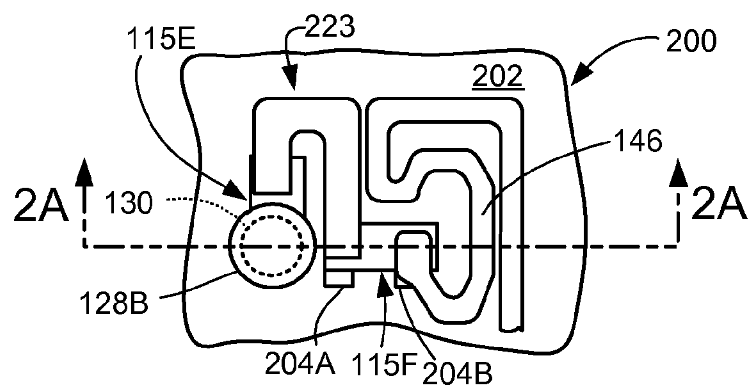
FIG. 2B is a partial top view of FIG. 2A showing a bridge, made from the first metal layer, with various layers removed.

Referring now to FIG. 2B, therein is shown a partial top view of FIG. 2A showing the bridge 115F, made from the first metal layer 114, with various layers removed. The circuit component 146, shown as a single coil inductor, is connected to the bridge 115F at one end. The bridge 115F contacts and connects the circuit component 146 to a redistribution line 223 at the other end. The redistribution line 223 is connected by the bridge 115E to the bump pad 130. The bump pad 130 is connected to the first interconnect 128B.

It has been discovered in the above arrangement, the circuit component 146 is well isolated from the substrate 202. Where the circuit component 146 is an inductor, this isolation results in the ability to increase the Q value of the inductor over that of a conventional inductor closer to the substrate 202.

Figure 3A:
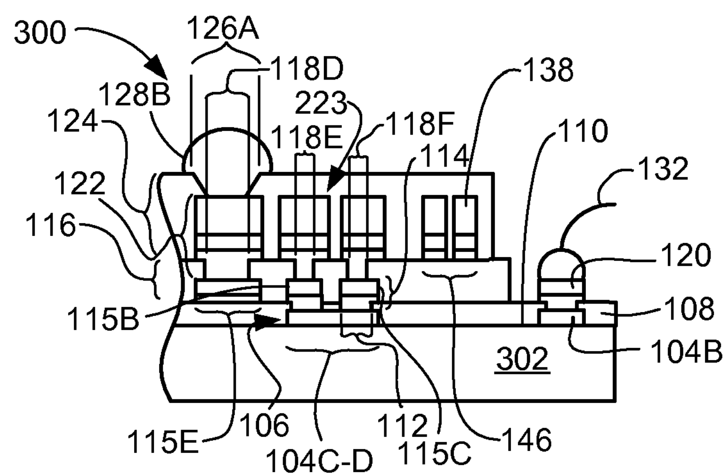
FIG. 3A is a cross-sectional view of a third integrated circuit package system with post-passivation interconnection and integration in another alternative embodiment of the present invention.

Referring now to FIG. 3A, therein is shown a cross-sectional view of a third integrated circuit package system 300 with post-passivation interconnection and integration in another alternative embodiment of the present invention. Similarly, the third integrated circuit package system 300 includes an integrated circuit die 302 having integral adjacent bond pads 104C-D, two or more bond pads formed as one, formed from the final metal layer 106.

The final metal layer 106 provides the integral adjacent bond pads 104C-D, which contacts the contacts 115B and 115C. The contact 115C provides the contact for the circuit component 146 formed from a portion of the second metal layer 122.

The first metal layer 114 is patterned and processed on the integral adjacent bond pads 104C-D and 104B through the passivation openings 112 as well as on the passivation layer 108. The first insulation layer 116 partially covers the passivation layer 108, if wire bonding is required, otherwise the first insulation layer 116 fully covers the passivation layer 108, and the first metal layer 114 with the first openings 118D-F exposing the first metal layer 114. Predetermined locations of the first metal layer 114 are the protective pads 120 not covered or surrounded by the first insulation layer 116. The second metal layer 122 is on the first metal layer 114 in the first openings 118D-F and on the first insulation layer 116. The second insulation layer 124 covers the first insulation layer 116 and partially covers the second metal layer 122 with the second opening 126A exposing the second metal layer 122. A second interconnect 132, such as a bond wire, is ball bonded on the protective pad 120 of the first metal layer 114.

It has been found that the protective pad 120 protect the wire bonding pad 104B from chemical attack in wet etching the second metal layer 122, and provide equal or even better wire bonding capability and reliability than the final metal 106.

The third integrated circuit package system 300 also includes a standard under bump metallurgy made from a number of metals or alloys, such as Ti, NiV, or Cu, for the first interconnects 128B.

Figure 3B:
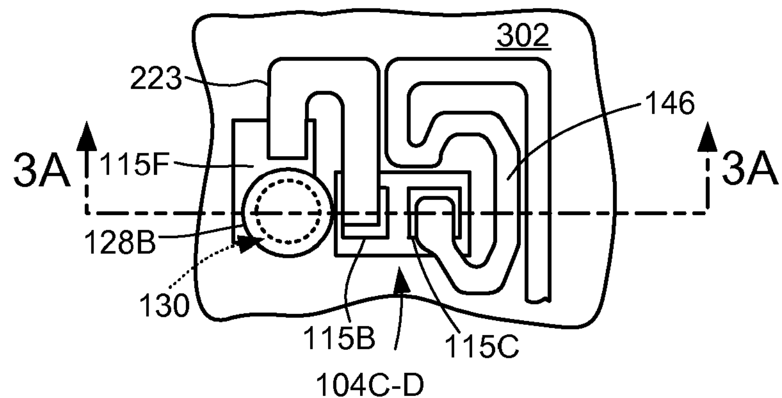
FIG. 3B is a partial top view of FIG. 3A showing adjacent integral bond pads, made from the final metal layer, with various layers removed.

Referring now to FIG. 3B, therein is shown a partial top view of FIG. 3A showing the integral adjacent bond pads 104C-D, made from the final metal layer 106, with various layers removed. The integral adjacent bond pads 104C-D are integral and act as a single bridge connecting at least two integrated circuit structures of the integrated circuit die 302. The integral adjacent bond pads 104C-D are connected at one end to the contact 115C, which connects to the circuit component 146, and are connected at the other end to the contact 115B, which connects to the redistribution line 223.

The redistribution line 223 and the stand alone bump pad 130 are connected by the bridge 115F made from the first metal layer 114 formed on the passivation layer 108. The stand alone bump pad 130 is connected to the first interconnect 128B at a location remote from the one end of the bridge 115F in contact with the integrated circuit die 302.

It has been discovered that the stand-alone and near symmetric configuration prevents non-uniform or non-symmetric stress distribution at the bump pad 130 and at the integral adjacent bond pads 104C-D to the integrated circuit die 302. Instead, the configuration allows the stress to be distributed symmetrically.

Figure 4:
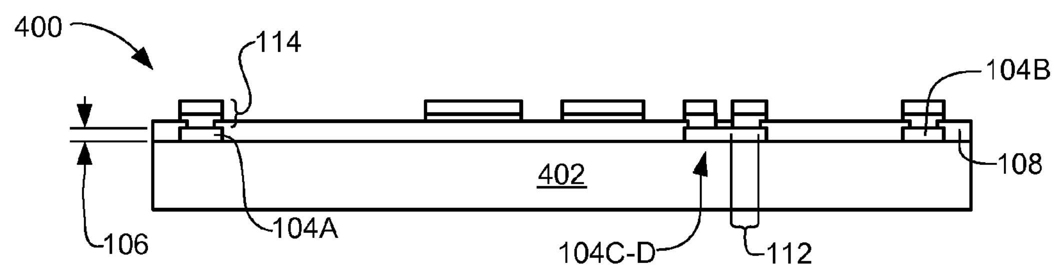
FIG. 4 is a cross-sectional view of a wafer structure in a first metallization phase in an embodiment of the present invention.

Referring now to FIG. 4, therein is shown a cross-sectional view of a wafer structure 400 in a first metallization phase in an embodiment of the present invention. The wafer structure 400 includes a wafer 402 having the final metal layer 106 and the passivation layer 108 provided thereon. The bond pads 104A-B and integral adjacent bond pads 104C-D are formed from different portions of the final metal layer 106. The passivation openings 112 expose the bond pads 104A-B and integral adjacent bond pads 104C-D through the passivation layer 108.

The first metal layer 114 is applied onto the wafer structure 400 using any number of methods, such as sputtering or plating. The first metal layer 114 is patterned using photoresist and etching, although other methods may be used. The photoresist is removed for further processing.

Figure 5:
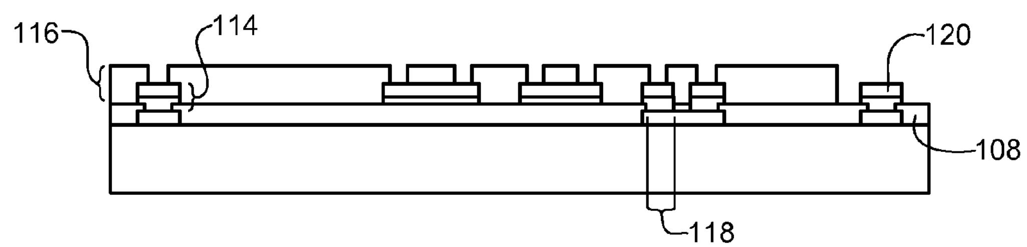
FIG. 5 is the structure of FIG. 4 in a first insulation phase.

Referring now to FIG. 5, therein is shown the structure of FIG. 4 in a first insulation phase. The first insulation layer 116 is applied onto the structure of FIG. 4 with spin coating, although other methods may be used. Patterns on the first insulation layer 116 may be formed with a number of processes, such as dry etch, wet etch, or dry etch with laser ablation. The patterns include the first openings 118 in the first insulation layer 116 exposing the first metal layer 114 and removal of the first insulation layer 116 exposing the protective pads 120 as well as the passivation layer 108. The first insulation layer 116 may undergo curing.

Figure 6:
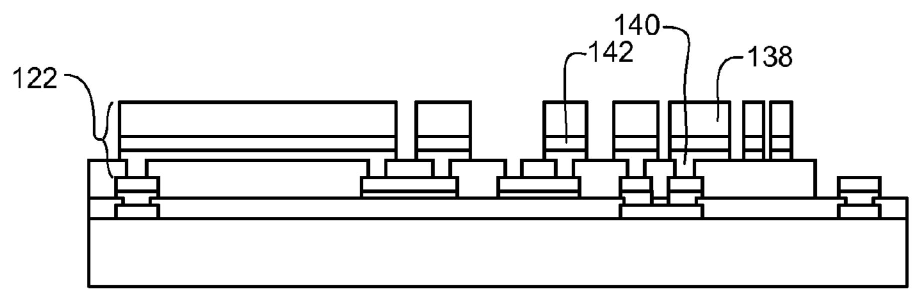
FIG. 6 is the structure of FIG. 5 in a second metallization phase.

Referring now to FIG. 6, therein is shown the structure of FIG. 5 in a second metallization phase. The second metal layer 122 is formed on the structure of FIG. 5. The second bottom layer 140, such as the adhesion layer, may be deposited. The middle layer 142 may optionally be deposited on the second bottom layer 140. Copper plating seed layer may be sputtered on the second bottom layer 140 or optionally on the middle layer 142. A thick photoresist is spin coated and patterned for the selective Cu plating. The second top layer 138 is electroplated to the desired thickness. The photoresist is removed by etching. The second bottom layer 140, the second top layer 138, and optionally the middle layer 142 are wet etched forming the pattern of the second metal layer 122. The portions of the second bottom layer 140 and the middle layer 142 covered by the second top layer 138 remains while portions not covered are etched away.

Figure 7:
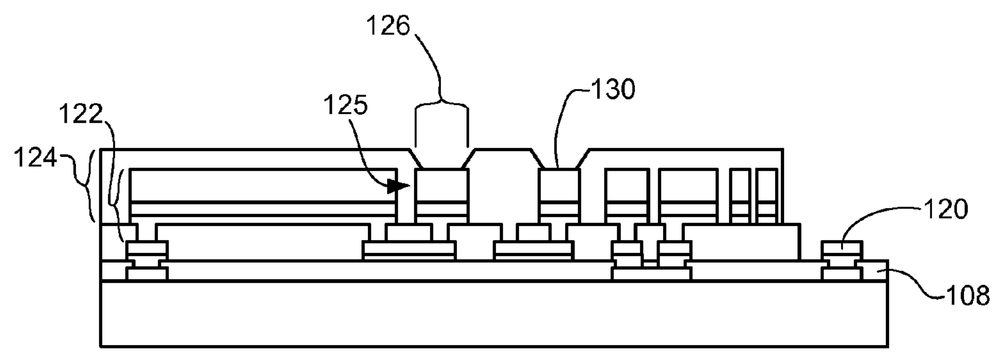
FIG. 7 is the structure of FIG. 6 in a second insulation phase.

Referring now to FIG. 7, therein is shown the structure of FIG. 6 in a second insulation phase. The second insulation layer 124 is spin coated onto the structure of FIG. 6. Patterns on the second insulation layer 124 may be formed with a number of processes, such as dry etch, wet etch, or dry etch with laser ablation. The patterns include the second openings 126 in the second insulation layer 124 to the bump pads 125 and 130 of the second metal layer 122 and removal of the second insulation layer 124 exposing the protective pads 120 as well as the passivation layer 108. The second insulation layer 124 may undergo curing.

Figure 8:
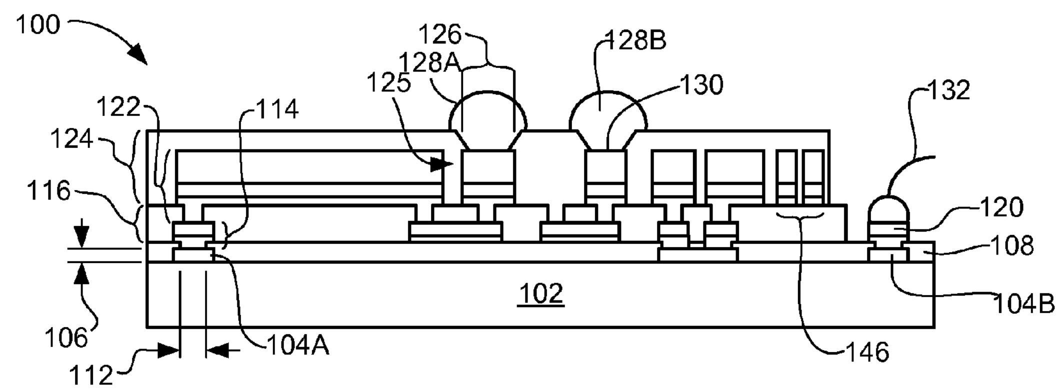
FIG. 8 is the structure of FIG. 7 in a singulation phase.

Referring now to FIG. 8, therein is shown the structure of FIG. 7 in a singulation phase. The first interconnects 128A-B are formed and attached on the bump pads 125 and 130 in the second openings 126. The wafer 402 of FIG. 4 having the final metal layer 106, the passivation layer 108, the first metal layer 114, the first insulation layer 116, the second metal layer 122, and the second insulation layer 124, the first interconnects 128A-B attached to the bump pads 125 and 130, and the protective pads 120 exposed undergo singulation forming the integrated circuit die 102 with the post-passivation stack described. The second interconnects 132 are attached to the protective pads 120 forming the first integrated circuit package system 100 with post-passivation interconnection and integration.

Figure 9:
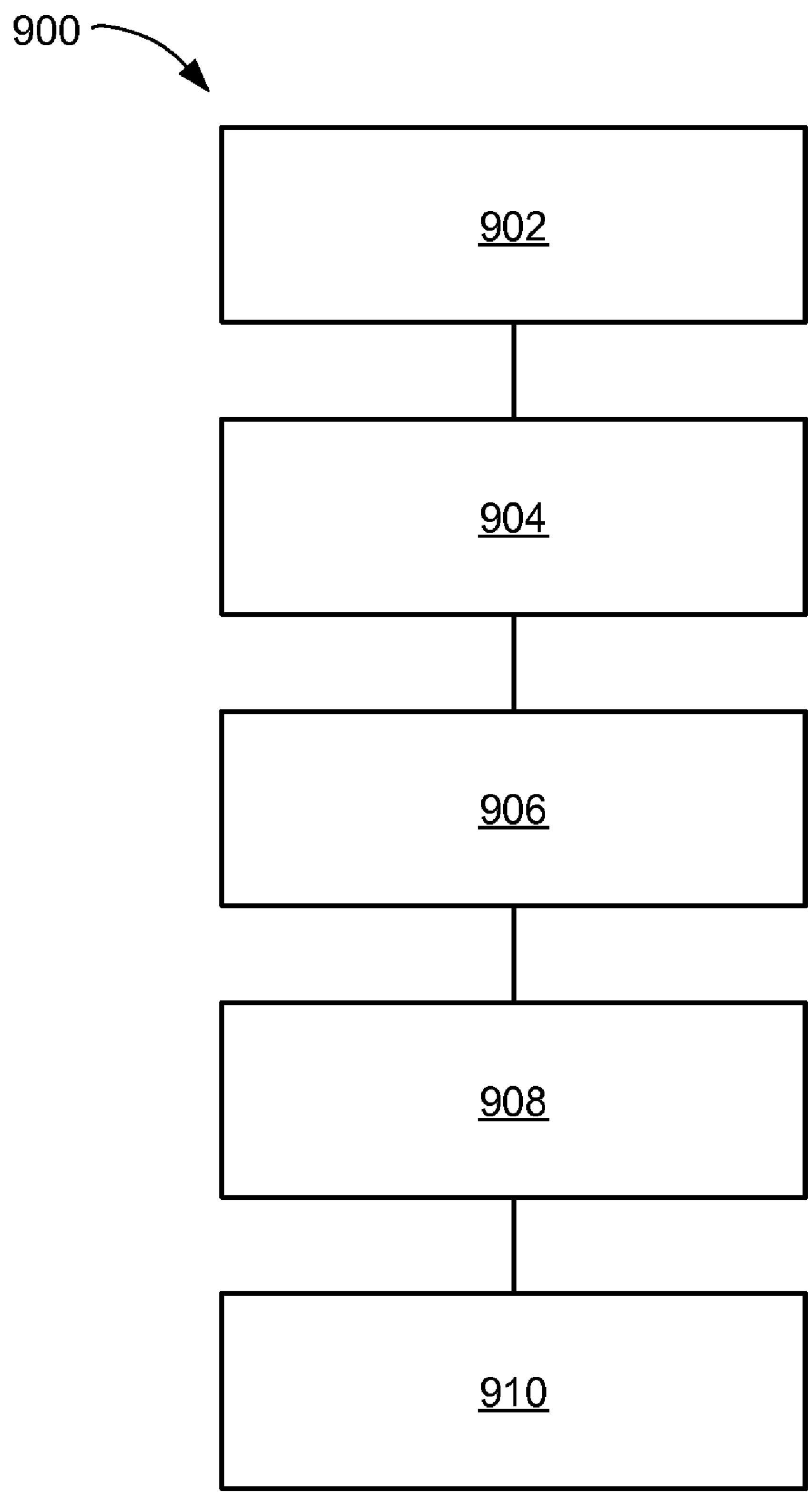
FIG. 9 is a flow chart of an integrated circuit package system with post-passivation interconnection and integration for manufacture of the integrated circuit package system in an embodiment of the present invention.

Referring now to FIG. 9, therein is shown a flow chart of an integrated circuit package system 900 with post-passivation interconnection and integration for manufacture of the integrated circuit package system 100 in an embodiment of the present invention. The system 900 includes an integrated circuit package system including: providing an integrated circuit die in a block 902, forming a first layer over the integrated circuit die in a block 904, forming a bridge on the first layer in a block 906, forming a second layer on the first layer in a block 908, and forming bump pads on and in the second layer, the bump pads connected to ends of the bridge in a block 910.

It has been discovered that the present invention thus has numerous aspects.

It has been discovered that the present invention provides flexibility for different electrical interconnect types, such as solder balls with bond wires, increasing the flexibility of increased input/output count, stacking, and packaging options for the integrated circuit die in an embodiment of the present invention. The post-passivation interconnection types and analog circuit integration lowers parasitics to enhance the integrated circuit die performance, and facilitate system-on-a-chip (SOC) and system-in-a-package (SIP) design with post-passivation passive structures.

An aspect is that the present invention provides features for improved manufacturing yield and lower cost. The stand alone and near symmetric copper pads for the solder balls prevent non-uniform or non-symmetric stress on the integrated circuit die to mitigate damage. The under ball metallization (UBM) is not required for the solder balls reducing the manufacturing steps to provide improved yields and lowers cost. The analog circuit integration in the post-passivation stack does not take up space on the integrated circuit die to reduce design complexity and reduces cost. The UBM for the solder ball is optional and may further reduce the cost of the integrated circuit die.

Another aspect of the present invention is the first metal layer (M1) protects the bond pads (IO pad) of the integrated circuit die from the etching process of the optional adhesion layer, the first bottom layer. The first metal layer may provide contacts for redistribution layer from the second metal layer and for the inductors in the second metal layer. The first metal layer also protects the bond pad during the wire bonding process. The final metal layer of the integrated circuit die may be used for bond pads or to contact the inductor in the second metal layer.

Yet another aspect of the present invention is that the flexibility for higher IO count, stacking configurations, and packaging configurations may be used for copper final metal layer and second metal layers or with other metals and alloys. The different interconnect types, such as solder balls and bond wires, allows for additional flexibility to connect crucial signal(s) closer or farther away from the analog circuit component, the inductor, in the post-passivation stack. This flexibility provides improved performance and electrical isolation. Both solder bumping and wire bonding may be supported without a gold layer thereby eliminating the need for a gold plating tool to further simplify the manufacturing process and reduce cost.

Yet another important aspect of the present invention is that it valuably supports and services the historical trend of reducing costs and increasing performance. These and other valuable aspects of the present invention consequently further the state of the technology to at least the next level.

Thus, it has been discovered that the integrated circuit package system with post-passivation interconnections and integration method of the present invention furnishes important and heretofore unknown and unavailable solutions, capabilities, and functional aspects for increasing chip density while minimizing the space required in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method for manufacturing an integrated circuit package system comprising:

providing an integrated circuit die with a bond pad;

forming a passivation layer over the integrated circuit die;

forming a first metal layer over the passivation layer to form a bridge directly on the passivation layer;

forming an insulation layer on the passivation layer, the insulation layer having openings provided therein; and forming a second metal layer including a redistribution layer between the bond pad and the bridge over the insulation layer, the second metal layer having separate portions, each separate portion connected to the bridge and directly on or in the insulation layer by the openings provided in the insulation layer.

2. The method as claimed in claim 1 wherein:

providing the integrated circuit die provides the integrated circuit die with adjacent bond pads; and forming the first metal layer includes forming another bridge connected at ends thereof to the adjacent bond pads.

3. The method as claimed in claim 1 wherein:

providing the integrated circuit die provides the integrated circuit die with integral adjacent bond pads;

forming the passivation layer provides openings therein exposing the integral adjacent bond pads;

forming the first metal layer forms separate contacts connected to the integral adjacent bond pads; and forming the second metal layer forms separate circuit components respectively connected to the separate contacts through openings in the insulation layer.

4. The method as claimed in claim 1 wherein forming the second metal layer forms a separate portion as a circuit component.

5. The method as claimed in claim 1 further comprising:

forming the second metal layer includes forming a bump pad; and connecting a solder ball on top of the bump pad.

6. An integrated circuit package system comprising:

an integrated circuit die with a bond pad;

a passivation layer over the integrated circuit die;

a first metal layer over the passivation layer including a bridge directly on the passivation layer;

an insulation layer on the passivation layer, the insulation layer having openings provided therein; and a second metal layer including a redistribution layer between the bond pad and the bridge over the insulation layer, the second metal layer having separate portions, each separate portion connected to the bridge and directly on or in the insulation layer.

7. The system as claimed in claim 6 wherein:

the integrated circuit die provides the integrated circuit die with adjacent bond pads; and the first metal layer includes another bridge connected at ends thereof to one of the adjacent bond pads.

8. The system as claimed in claim 6 wherein:

the integrated circuit die provides the integrated circuit die with integral adjacent bond pads;

the passivation layer provides openings therein exposing the integral adjacent bond pads;

the first metal layer is formed into separate contacts with the separate contacts connected to the integral adjacent bond pads; and the second metal layer is formed into separate circuit components respectively connected to the separate contacts through openings in the insulation layer.

9. The system as claimed in claim 6 wherein the second metal layer has a separate portion in the form of a circuit component.

10. The system as claimed in claim 6 wherein:

the second metal layer has a separate portion in the form of a bump pad; and a solder ball is on top of the bump pad.

* * * * *